United States Patent
Schauer et al.

(10) Patent No.: US 7,838,398 B2
(45) Date of Patent: Nov. 23, 2010

(54) EPITAXIALLY COATED SEMICONDUCTOR WAFER AND DEVICE AND METHOD FOR PRODUCING AN EPITAXIALLY COATED SEMICONDUCTOR WAFER

(75) Inventors: Reinhard Schauer, Laufen (DE); Norbert Werner, Tengling (DE)

(73) Assignee: Siltronic AG, Munich (DE)

( * ) Notice: Subject to any disclaimer, the term of this patent is extended or adjusted under 35 U.S.C. 154(b) by 369 days.

(21) Appl. No.: 11/985,092

(22) Filed: Nov. 14, 2007

(65) Prior Publication Data

US 2008/0118712 A1    May 22, 2008

(30) Foreign Application Priority Data

Nov. 22, 2006  (DE) ........................ 10 2006 055 038

(51) Int. Cl.
- *H01L 21/76* (2006.01)
- *C30B 23/00* (2006.01)
- *C30B 25/00* (2006.01)
- *C30B 28/12* (2006.01)
- *C30B 28/14* (2006.01)

(52) U.S. Cl. ............................. 438/507; 257/E21.463; 117/84

(58) Field of Classification Search ................. 438/507; 257/E21.463; 117/84
See application file for complete search history.

(56) References Cited

U.S. PATENT DOCUMENTS

| 6,129,047 | A  | 10/2000 | Nakamura |
| 6,596,095 | B2 | 7/2003  | Ries et al. |
| 6,825,487 | B2 | 11/2004 | Preece |
| 7,101,794 | B2 | 9/2006  | Schauer et al. |
| 2004/0266181 | A1 | 12/2004 | Schauer et al. |
| 2006/0079089 | A1 | 4/2006  | Schauer et al. |

(Continued)

FOREIGN PATENT DOCUMENTS

CN    1434883 A    8/2003

(Continued)

OTHER PUBLICATIONS

Jpn. J. Appl. Phys. vol. 38, (199) pp. 38-39, A new method for the precise measurement of wafer roll off of silicon polished wafer, author: Masahiro Kimura et al.

(Continued)

*Primary Examiner*—Alexander G Ghyka
*Assistant Examiner*—Seahvosh J Nikmanesh
(74) *Attorney, Agent, or Firm*—Brooks Kushman P.C.

(57) ABSTRACT

In a method for producing epitaxially coated semiconductor wafers, a multiplicity of prepared, front side-polished semiconductor wafers are successively coated individually with an epitaxial layer on their polished front sides at temperatures of 800-1200° C. in a reactor, while supporting the prepared semiconductor wafer over a susceptor having a gas-permeable structure, on a ring placed on the susceptor which acts as a thermal buffer between the susceptor and the supported semiconductor wafer, the semiconductor wafer resting on the ring, and its backside facing but not contacting the susceptor, so that gaseous substances are delivered from a region over the backside of the semiconductor wafer by gas diffusion through the susceptor into a region over the backside of the susceptor, the semiconductor wafer contacting the ring only in an edge region of its backside, wherein no stresses measurable by means of photoelastic stress measurement ("SIRD") occur in the semiconductor wafer.

19 Claims, 2 Drawing Sheets

U.S. PATENT DOCUMENTS

2006/0213424 A1 * 9/2006 Mueller et al. .............. 117/15

FOREIGN PATENT DOCUMENTS

| CN | 1805122 A | 7/2006 |
|---|---|---|
| DE | 10328842 | 1/2005 |
| KR | 2001-0031714 | 4/2001 |
| KR | 2003-0080600 | 10/2003 |
| WO | 9923276 A1 | 5/1999 |
| WO | 0186035 A1 | 11/2001 |

OTHER PUBLICATIONS

English Abstract corresponding to KR 2003-0080600.
WO 99/23276 is an English language equivalent to KR 2001-0031714.

* cited by examiner

EPITAXIALLY COATED SEMICONDUCTOR WAFER AND DEVICE AND METHOD FOR PRODUCING AN EPITAXIALLY COATED SEMICONDUCTOR WAFER

BACKGROUND OF THE INVENTION

1. Field of the Invention

The invention relates to a semiconductor wafer having a front side coated by chemical vapor deposition (CVD) and to a method for producing this semiconductor wafer. The invention also relates to a device for supporting a semiconductor wafer during the deposition of a layer on a front side of the semiconductor wafer by chemical vapor deposition (CVD).

2. Background Art

During chemical vapor deposition, in particular the deposition of an epitaxial layer on a polished semiconductor wafer, two phenomena may occur, inter alia, which are known by the terms "autodoping" and "halo".

In "autodoping", dopants pass from the backside of the semiconductor wafer via the gas phase into the deposition gas, which is fed over the front side of the semiconductor wafer. They are then incorporated into the epitaxial layer, predominantly in the edge region of the front side of the semiconductor wafer, and therefore cause a more or less pronounced undesired radial variation in the resistivity of the epitaxial layer.

"Halo" refers to a scattered light effect which is caused by light-scattering structures on the backside of the semiconductor wafer and is observable by shining a collimated light beam onto the backside of the semiconductor wafer. The structures mark transitions, on the surface of the backside of the semiconductor wafer, at which regions with a native oxide layer adjoin regions where such an oxide layer is not present or is no longer present. These transitions occur when removal of the native oxide layer during the pretreatment in a hydrogen atmosphere ("pre-bake") before the actual epitaxial deposition was incomplete. One possibility for quantifying this effect consists in a scattered-light measurement of the haze (turbidity, opacity), for example with an SP1 light scattering meter from KLA Tencor, in the so-called DNN ("DarkField Narrow Normal") or DWN ("DarkField Wide Normal) channel.

In order to avoid problems with "autodoping", U.S. Pat. No. 6,129,047 proposes to provide slits in the bottom of the susceptor's recess ("pocket") holding the semiconductor wafer, the slits being arranged on the outer edge of the bottom of the susceptor. Dopants diffusing out from the backside of the semiconductor wafer can be removed from the reactor, without previously reaching the front side of the semiconductor wafer, by a flushing gas which is fed through slits in the susceptor onto the wafer backside.

According to U.S. Pat. No. 6,596,095 B2, small bores along the entire bottom surface of the susceptor serve the same purpose. Here again, the dopant diffusing out from the backside of the semiconductor wafer is transported away by feeding a flushing gas past the susceptor. These measures are also effective against "Halo" formation because they facilitate removal of the native oxide layer, since gaseous reaction products which are created by dissolving the native oxide are likewise transported away through the holes in the bottom and the flushing gas flowing past the susceptor.

DE 10328842 discloses a susceptor, which has a gas-permeable structure with a porosity of at least 15% and a density of from 0.5 to 1.5 g/cm³. By using such a porous susceptor, the gaseous reaction products which are formed during the pretreatment by dissolving the native oxide layer as well as the dopants diffusing from the semiconductor wafer to be coated, can escape through the pores of the susceptor to the backside of the susceptor, be taken up by a flushing gas flow, and thus be removed from the reactor. Using the described susceptor also avoids undesired nanotopography effects on the backside of the semiconductor wafer, which occur in the case of susceptors with holes. Holes in the susceptor affect the temperature field on the front side and backside of the semiconductor wafer to be coated, which leads to locally different deposition rates and finally to such nanotopography effects. The term nanotopography refers to height variations in the nanometer range, which are measured over a lateral extent of from 0.5 mm to 10 mm.

Another problem in the epitaxial coating of semiconductor wafers involves stresses in the epitaxially coated semiconductor wafers, which can lead to dislocations and slips. Several methods for identifying slips in semiconductor wafers are known: for example by visual inspection with collimated light, by means of devices for inspecting the surface of semiconductor wafers, or with devices which are suitable for determining the nanotopography.

The most sensitive method in this context, however, is SIRD ("Scanning Infrared Depolarization") since not only slips but also photoelastic stresses can be measured by means of SIRD. The SIRD method for identifying stress fields, slips, sliplines, epitaxial defects, which is based on optical birefringence being introduced, is described for example in U.S. Pat. No. 6,825,487 B2.

Thermally induced stresses in epitaxially coated semiconductor wafers can be avoided during the epitaxial coating of semiconductor wafers by reducing the temperatures during the pretreatment steps in a hydrogen atmosphere (bake) and with the addition of hydrogen chloride to the hydrogen atmosphere (HCl etch) and in the actual coating step.

Lower coating temperatures, however, lead to an increased occurrence of undesired crystal defects such as stacking faults or typical epitaxial defects which are known by the terms "hillocks", "mounds" or "pits". At very low temperatures, polycrystalline growth may even take place. Another disadvantage is an inferior edge roll-off of the epitaxial layer as well as a deterioration in the local planarity of the semiconductor wafer (geometry, SFQR). The growth rate is furthermore reduced with lower deposition temperatures, which makes the process less economical. Reducing the pretreatment and deposition temperatures is therefore not acceptable owing to the associated disadvantages.

The prior art has not yet revealed any solution relating to the reduction of stresses, dislocations and slips in epitaxially coated semiconductor wafers with the high pretreatment and deposition temperatures which are categorically necessary, as explained above.

SUMMARY OF THE INVENTION

It was therefore an object of the invention to provide stress-free epitaxially coated semiconductor wafers having good edge roll-off values as well as good local planarity, while avoiding undesired crystal defects, backside halo, autodoping and nanotopography effects. These and other objects are achieved by the invention, in which a ring acting as a thermal buffer is positioned between the wafer and a porous susceptor.

BRIEF DESCRIPTION OF THE DRAWINGS

The invention will be illustrated below with the aid of figures.

DETAILED DESCRIPTION OF THE PREFERRED EMBODIMENT(S)

Figure 1:
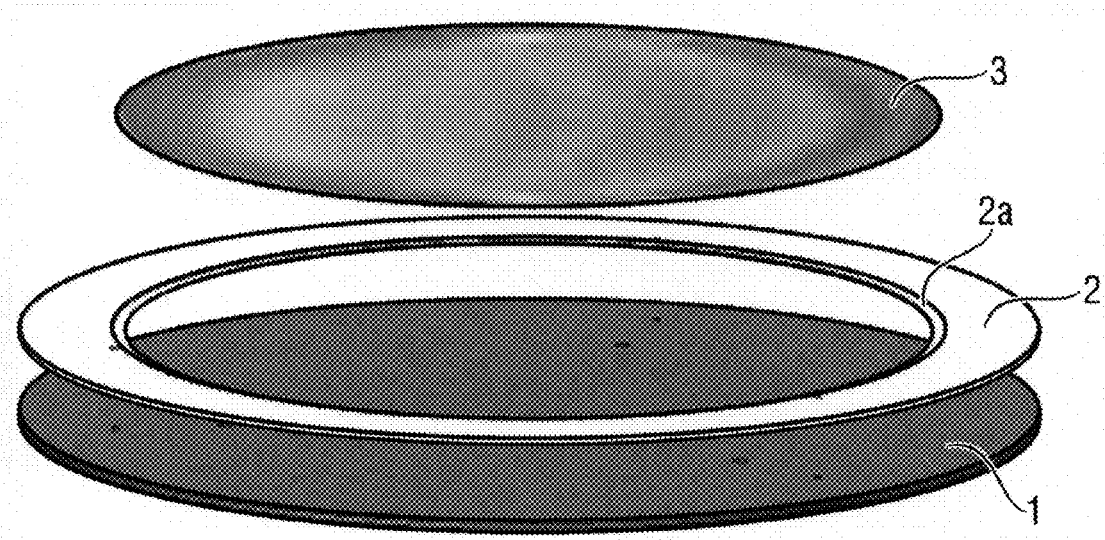
FIG. 1 shows a device according to the invention.

The invention thus relates to a device for supporting a semiconductor wafer during the deposition of a layer on a front side of the semiconductor wafer by chemical vapor deposition, for example in an epitaxial reactor, the reactor containing a susceptor which has a gas-permeable structure, and a ring placed on the susceptor which acts as a thermal buffer between the susceptor and the supported semiconductor wafer.

The susceptor is preferably one which has a porosity (pore volume/total volume) of at least 15% and a density of from 0.5 to 1.5 $g/cm^3$. The necessary porosity and density of the susceptor may be obtained by suitable compression of fibers or particles during production of the susceptor. The susceptor preferably consists of graphite or graphite fibers, and is preferably coated with silicon carbide.

The device according to the invention comprises a ring which is placed on the susceptor, the ring preferably being selected in respect of its thickness and in respect of its material properties so that it acts as a thermal buffer between the susceptor and the supported semiconductor wafer.

This ring preferably has an inner diameter which is less than the diameter of the semiconductor wafer to be received.

The outer diameter of the ring is preferably greater than the diameter of the semiconductor wafer to be received, and preferably corresponds to the diameter of the susceptor. An outer diameter of the ring which is a few mm greater than the diameter of the susceptor is particularly preferred.

The ring is preferably at least 0.5 mm thick, more preferably 0.5-1.5 mm thick and most preferably 1 mm thick. Preferably, the ring also has an annular recess for receiving semiconductor wafers. The annular recess preferably has a depth of 0.3-0.7 mm, more preferably 0.5 mm, and a width of 3-15 mm, more preferably about 6 mm, and is preferably a ring of silicon carbide. The use of a graphite ring coated with silicon carbide, is also preferred.

The ring preferably consists of a material having a thermal conductivity at 1000° C. of 5-100 W/mK, more preferably 5-50 W/mK and most preferably 10-30 W/mK.

The inventive device is preferably used in single-wafer reactors. Use in single-wafer reactors from ASM and Applied Materials (AMAT Centura Epi) is particularly preferred. The device is preferably configured to receive semiconductor wafers having a diameter of 150 mm, 200 mm, 300 mm and 450 mm.

Object(s) of the invention are also achieved by a method for producing epitaxially coated semiconductor wafers, in which a multiplicity of semiconductor wafers polished at least on their front sides are prepared and successively coated individually by applying an epitaxial layer onto their polished front sides by chemical vapor deposition at temperatures of 800-1200° C. in an epitaxial reactor, by respectively supporting one of the prepared semiconductor wafers on a device containing a susceptor which has a gas-permeable structure and a ring, placed on the susceptor, which acts as a thermal buffer between the susceptor and the supported semiconductor wafer so that the semiconductor wafer rests on the ring, its backside faces a bottom of the susceptor having a gas-permeable structure but does not touch the susceptor, so that gaseous substances are delivered from a region over the backside of the semiconductor wafer by gas diffusion through the susceptor into a region over the backside of the susceptor, and furthermore the semiconductor wafer comes in contact with the ring only in the edge region of its backside, with no stresses measurable by means of photoelastic stress measurement ("SIRD") occurring in the semiconductor wafer.

In the method according to the invention, a multiplicity of semiconductor wafers polished at least on their front sides are initially prepared. To this end, a single crystal produced according to the prior art, preferably by crucible pulling according to Czochralski, is sliced into a multiplicity of semiconductor wafers by means of known slicing methods, preferably using wire saws with free abrasive ("slurry") or bound abrasive (diamond wire).

Mechanical processing steps are furthermore carried out, for instance sequential single-sided grinding methods, simultaneous double-sided grinding methods (DDG) or lapping. The edge of the semiconductor wafer, including any existing mechanical markings such as a notch or a flat, are generally also processed ("edge-notch grinding"). Chemical treatment steps may be furthermore provided, for example cleaning and etching steps.

After the grinding, cleaning and etching steps, according to the prior art, the surface of the semiconductor wafers is preferably smoothed by stock polishing. This is preferably done by double-sided polishing (DSP), to which end the semiconductor wafers are placed loosely in a thin toothed disk and polished simultaneously on the front side and backside while "floating freely" between an upper polishing plate and a lower polishing plate, covered with a polishing cloth.

The front sides of the prepared semiconductor wafers are furthermore preferably polished free from streaks, for example by a soft polishing cloth with the aid of an alkaline polishing sol. In the literature, this step is often referred to as CMP polishing ("chemical-mechanical polishing"). After polishing, the semiconductor wafers are preferably subjected to hydrophilic cleaning and drying according to the prior art.

Epitaxial layers are subsequently deposited on the polished front sides of the prepared semiconductor wafers in a single-wafer reactor. The semiconductor wafer in this case rests, not directly on the susceptor, but on a ring which is positioned above the surface of the susceptor, so that the backside of the semiconductor wafer faces a bottom of the susceptor. The bottom of the susceptor has a gas-permeable structure, preferably with a porosity (pore volume/total volume) of at least 15% and a density of from 0.5 to 1.5 $g/cm^3$. The ring preferably rests directly on the susceptor. The ring is thus not connected to the susceptor.

The ring is preferably selected with respect to its thickness and with respect to its material properties so that it acts as a thermal buffer between the susceptor and the supported semiconductor wafer. The ring is preferably at least 0.5 mm thick, more preferably 0.5-1.5 mm thick and most preferably 1 mm thick, and preferably has an annular recess for receiving semiconductor wafers. The annular recess preferably has a depth of 0.3-0.7 mm, more preferably 0.5 mm, a width of 3-15 mm, more preferably 6 mm, and is preferably a ring of silicon carbide. The use of a graphite ring, which is coated with silicon carbide, is also preferred.

The ring preferably consists of a material having a thermal conductivity at 1000° C. of 5-100 W/mK, more preferably 5-50 W/mK and most preferably 10-30 W/mK.

The epitaxial reactor is preferably a single-wafer reactor, more preferably a single-wafer reactor from ASM or Applied Materials (AMAT Centura Epi). The prepared semiconductor wafers preferably have a diameter of 150 mm, 200 mm, 300 mm and 450 mm.

The inventors have discovered that the effects of susceptors already described in the prior art having gas-permeable structures in general, e.g. felt, pores, holes, slits, and/or bores on the properties of the backside of the semiconductor wafer with respect to halo and nanotopography, are also maintained in the method according to the invention, i.e. for the case in which the semiconductor wafer rests, not directly on the susceptor, but on a ring.

This is already observable during the pretreatment of the semiconductor wafer when the semiconductor wafer to be epitaxially coated is preheated and exposed to a flushing gas, usually a hydrogen atmosphere, in order to remove the native oxide layer.

The gaseous reaction products formed when dissolving the oxide layer, as well as the dopant diffusing from the semiconductor wafer, escape by gas diffusion through the gas-permeable structure of the susceptor, i.e. through the pores or openings of the susceptor, through to the backside of the susceptor where they are taken up by the flow of flushing gas and removed from the reactor stream.

After the oxide layer has been removed, an etchant, preferably hydrogen chloride, is added to the flushing gas in order to smooth the surface of the front side of the semiconductor wafer before depositing the epitaxial layer.

In order to deposit the epitaxial layer, the semiconductor wafer to be epitaxially coated is brought to the deposition temperature and the front side of the semiconductor wafer is brought in contact with a deposition gas, while the backside of the substrate wafer preferably continues to be exposed to the effect of the flushing gas.

The deposition gas contains compounds which, after they are chemically cleaved, provide substances that form the layer. These substances preferably include silicon, germanium and dopants such as boron. A deposition gas made up of trichlorosilane, hydrogen and diborane is particularly preferred. After the epitaxial layer has been deposited, the epitaxially coated semiconductor wafer is cooled, for example in a flow of hydrogen which is fed through the reactor.

The effect of the ring resting on the susceptor is that the semiconductor wafer has no contact with the susceptor and therefore has no stress points in its surface. The semiconductor wafer is therefore stress-free, i.e. has no mechanical stresses, in its surface. A ring made of silicon carbide furthermore serves to create a kind of insulation or thermal buffer between the semiconductor wafer and the susceptor. The effect of this is that no thermally induced stresses which could lead to dislocations and slips occur, even on the bearing points at the edge.

For example, the SIRD Metrology System from PVA TePla or the SIRD-300 device from JenaWave is suitable for determination of stresses. The sensitivity of the TePla SIRD device is 6 kPa. A stress-free semiconductor wafer in the scope of this invention is therefore intended to mean a semiconductor wafer which has no stresses of 6 kPa or more. Both the front side and backside and also the edge region of the semiconductor wafer can be studied with these SIRD measuring instruments. There is no edge exclusion, as for example in the case of geometry measuring instruments. Unless otherwise indicated, data regarding stresses in semiconductor wafers studied by means of SIRD therefore relate respectively to the front side and backside and to the edge region (without edge exclusion) of the semiconductor wafer.

Silicon carbide is also particularly suitable as a ring material because it is hard, solid but not brittle (like for instance, quartz), relatively inexpensive and furthermore readily processable. Silicon carbide is opaque (turbid), and therefore does not lead to light guide effects.

The single-wafer reactors used are heated from above and below by means of IR lamps. The effect of this, when using a conventional susceptor, is that the semiconductor wafer is at a higher temperature than the susceptor during the pretreatment and coating steps. Thermally induced stresses therefore occur at the points of contact with the susceptor, which in the worst case can lead to dislocations and slips in the semiconductor wafer.

In the case of a susceptor having a ring, especially a ring of silicon carbide, however, the temperature of the ring is higher than that of the susceptor and has a temperature value close to the temperature of the semiconductor wafer. The thermal stresses occurring in the prior art can therefore be avoided. The effect also occurs when the temperature of the semiconductor wafer is lower than the temperature of the susceptor, as is the case when cooling the semiconductor wafer after the deposition process. Here again, the ring acts as a kind of thermal buffer.

Another advantage of the method according to the invention and the device according to the invention is that the ring can be processed very accurately, specifically both in its dimensioning and with respect to its roughness. The adaptation of the device according to the invention to the semiconductor wafer can therefore be improved, which also makes it possible to avoid mechanical stress fields at the bearing points of the semiconductor wafer.

According to the invention, the ring preferably rests directly on the susceptor. The alternative, i.e. to hold the ring a few millimeters above the susceptor surface by means of spacers, is not preferred, because although this would have the advantage that gases diffusing out from semiconductor wafers doped heavily on the backside could escape laterally below the ring and "autodoping" effects could therefore be reduced, on the other hand the thermal equilibration effect would nevertheless be reduced owing to the increased distance of the ring (and therefore the semiconductor wafer) from the susceptor, and the susceptibility in terms of thermally induced stresses and slips would be increased. Deposition gas could furthermore enter between the ring and the susceptor so that the wafer backside would also be coated, which is undesirable.

In the method according to the invention, conversely, the ring preferably rests firmly so that any backside depositions are avoided due to the deposition gas being unable to enter between the susceptor and the semiconductor wafer, and therefore unable to reach the backside of the semiconductor wafer.

The semiconductor wafer to be epitaxially coated is preferably a wafer of monocrystalline silicon, onto which an epitaxial silicon layer is applied, and is preferably polished at least on its front side. Preferably, the semiconductor wafer to be epitaxially coated is etched and polished on its backside, and has a diameter of 150 mm, 200 mm, 300 mm or 450 mm.

Another advantage of the method according to the invention is that it allows the process window to be widened with respect to the deposition temperatures. For example, conventionally, p− silicon wafers (silicon wafers with a low doping level) are more sensitive to stresses than p+ silicon wafers with a higher doping level. The temperature for depositing an epitaxial layer onto p+ silicon wafers can therefore be selected to be higher compared with p− silicon wafers.

Typical deposition temperatures according to the prior art (in single-wafer reactors) are as follows: for p−/p+ (weakly doped epitaxial layer on heavily doped silicon wafers): 1120-1150° C.; for p−/p− (weakly doped epitaxial layer on weakly doped silicon wafers): 1080-1120° C.

In the inventive method, conversely, the temperature ranges can be increased preferably by 20-30° C. (i.e. up to 1180° C. for p−/p+ and up to 1150° C. for p−/p−): an epitaxially coated silicon wafer is obtained which is stress-free according to SIRD, with reduced defects and an improved geometry compared with the prior art.

The deposition temperatures in the scope of this invention are therefore preferably selected as follows: for silicon wafers with a high doping level (p+), the epitaxial deposition is preferably carried out at a temperature of 1140-1180° C.; for silicon wafers with a low doping level (p−), the deposition is preferably carried out at a temperature of 1100-1150° C.

Another advantage of the elevated deposition temperatures is that the edge roll-off of the polished semiconductor wafer can thereby be improved, since the layer thickness profile of the epitaxial layer at the edge of the semiconductor wafer increases with elevated deposition temperatures, and the edge roll-off can thereby be compensated.

The described method is suitable for producing a semiconductor wafer which comprises a front side and a backside, which is provided on its front side with an epitaxial layer that is furthermore free from stresses according to photoelastic stress measurement ("SIRD") and which furthermore has a nanotopography on its backside, expressed as PV height variation (=peak to valley) of greater than or equal to 2 nm and less than or equal to 5 nm based on square measurement windows with an area of 2 mm×2 mm and a backside "halo" expressed as haze of greater than or equal to 0.1 ppm and less than or equal to 5 ppm.

The semiconductor wafer according to the invention is free from stresses according to characterization by SIRD, and has good nanotopography and haze values on its backside. The semiconductor wafers have on the one hand no stress points in their surfaces and are therefore stress-free, i.e. free from any mechanical or thermally induced stresses, in the surfaces.

By using a ring of silicon carbide in the method of the invention, which, as already described above, can be processed very well (particularly in respect of its roughness), the mechanical stress fields at the edge of the semiconductor wafer (in the prior art at the bearing points of the semiconductor wafer on the susceptor) can moreover be avoided. The semiconductor wafers according to the invention are therefore preferably free from any stresses according to characterization by means of photoelastic stress measurement (SIRD), both on their front sides and on their backsides as well as in edge regions.

The crystal defects, referred to as LPD ("light point defects") owing to the measurement method employed, are for example epi stacking faults, hillocks or pits, and in general structural epitaxy defects which can be detected by means of light scattering as LLS ("localized light scatterers") by surface inspection instruments, for example KLA Tencor Surfscan SP1.

Studies on semiconductor wafers according to the invention showed the following results, respectively measured in the dark field, oblique mode (DWO, DNO) (oblique incidence angle of the laser in the SP1):

| Defect size class: | 50% of wafers | 97.7% of wafers |
|---|---|---|
| ≧50 nm | ≦2 defects | ≦8 defects |
| ≧90 nm | 0 defects | ≦4 defects |
| ≧120 nm | 0 defects | ≦3 defects |
| ≧200 nm | 0 defects | ≦2 defects |

For a yield of >=97.7% (economically acceptable >=90%) this means: 8 LLS defects >=50 nm; 4 LLS defects >=90 nm; 3 LLS defects >=120 nm; 2 LLS defects >=200 nm.

With respect to the local planarity of the semiconductor wafers of the invention, the following results are found:

The semiconductor wafer preferably has a maximum local planarity value $SFQR_{max}$ of greater than or equal to 0.025 μm and less than or equal to 0.04 μm.

The maximum local planarity value $SFQR_{max}$ of from 0.025 μm to 0.04 μm is preferably based on at least 99% of the subregions of a two-dimensional grid of measurement windows with a size of 26×8 mm$^2$ on the front side of the coated semiconductor wafer and an edge exclusion of 2 mm.

Comparison with semiconductor wafers epitaxially coated on a standard susceptor (according to the prior art, i.e. without a ring support) shows a significant improvement in the semiconductor wafers of the invention. Comparative tests under otherwise equal process conditions, but by using a standard susceptor instead of the device according to the invention, gave a maximum local planarity value SFQRmax of 0.045-0.08 μm for the epitaxially coated semiconductor wafers.

The semiconductor wafers of the invention preferably have an R3O−1 mm parameter of from −10 nm to +10 nm which corresponds to a deviation, measured at a distance of 1 mm from the edge of the silicon wafer, of an average cross section determined by thickness measurement from a reference line determined by regression. This is an edge roll-off parameter. The epitaxially coated semiconductor wafers preferably have an R3O−1 mm parameter of from −5 nm to +5 nm. A negative R3O−1 mm value corresponds to a roll-up, i.e. in this case an edge roll-off of the semiconductor wafer which is overcompensated for by the epitaxial coating.

A method for measuring the edge roll-offs of silicon wafers is described in JPN. J. APPL. PHYS. Vol. 38 (1999) pp 38-39. Edge roll-off parameters related to the thickness of a silicon wafer may, for example, be determined by means of the NanoPro NP1 topography measuring system from KLA Tencor, by initially calculating 360 radial cross sections with a spacing of 1° of the entire image (topography, "wafer map") of a silicon wafer, starting at the center of the wafer. The cross sections are conventionally divided into 4 sectors S2 to S5 (respectively 90° sectors) and all 90 radial cross sections are averaged for each sector. For a region with a distance of from R−5 mm to R−35 mm from the edge of the wafer, a 3rd order fitted reference line ("best fit") is calculated. Finally, the fourfold symmetry of the edge roll-off is averaged out (by averaging over all the radial thickness cross sections) and for example an R3O−1 mm parameter is obtained by determining the deviation between the averaged radial cross section and the reference line determined by regression at a distance of R−1 mm from the edge of the wafer.

The deviations between the average radial cross sections per sector (individual tracks) and the reference line may also be considered as an alternative, so as to obtain a roll-off value for each sector. In the scope of the present invention, average roll-off values were considered.

The semiconductor wafers of the invention preferably have a resistance uniformity in the epitaxial layer of greater than or equal to ±2% and less than or equal to ±5%.

A μPCD lifetime is preferably 2500-3000 μs. This is the minority carrier or recombination lifetime (μPCD="micro photo conductive decay"), which is determined by means of light technology excitation and subsequent measurement of the decay curve.

The semiconductor wafers are preferably semiconductor wafers polished on the front side and provided with an epitaxial layer on the polished front side, preferably, the semiconductor wafers are also etched and polished on their backside. Preferably, the semiconductor wafers have a diameter of 150 mm, 200 mm, 300 mm or 450 mm, and are preferably wafers of monocrystalline silicon, onto which an epitaxial silicon layer is applied.

Figure 4:
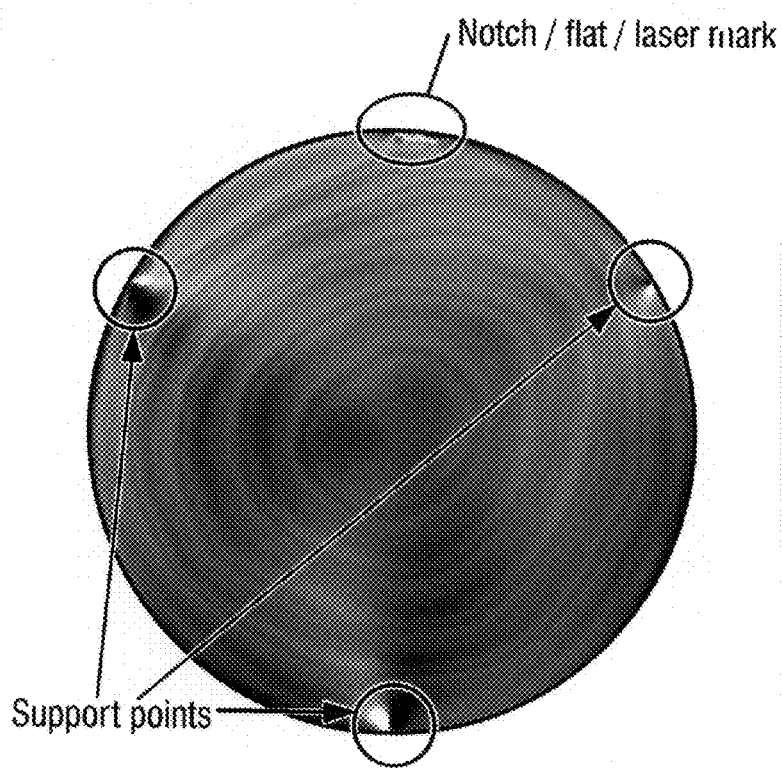
FIG. 4 shows the meaning of bearing points visible in FIG. 3 caused by the wafer being supported on the supporting device of the SIRD instrument.

The meaning of the bearing points visible at the edge in SIRD measurements is explained by FIG. 4.

FIG. 1 schematically shows the structure of the device according to the invention. The ring 2 is placed on the susceptor 1. The ring 2 and the susceptor 1 have their dimensions configured to receive the substrate 3. The ring 2 contains a recess 2a in the edge region to receive the substrate 3.

Figure 2:
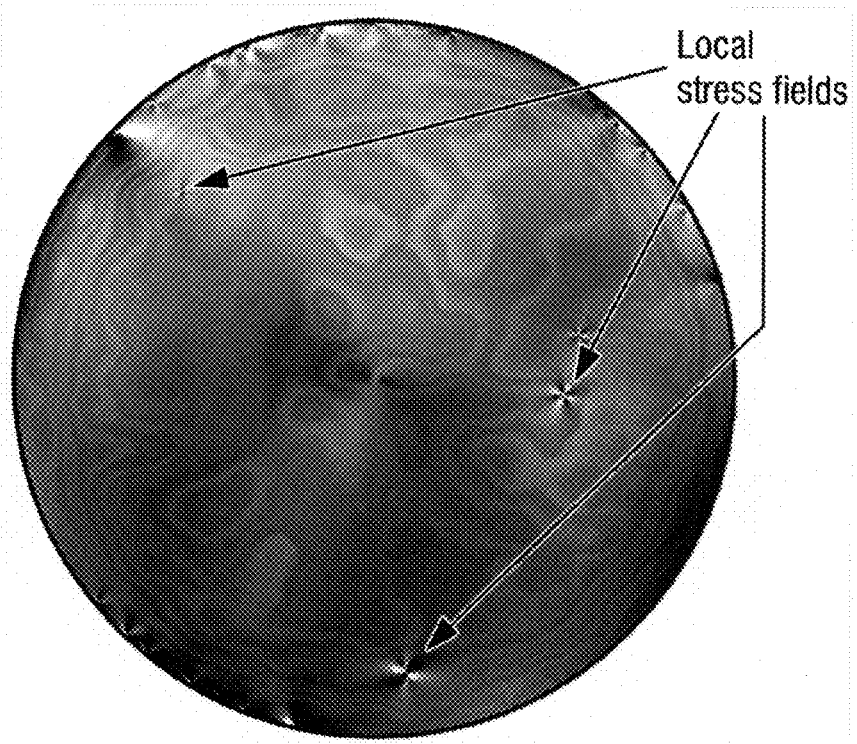
FIG. 2 shows the result of an SIRD measurement (prior art).

FIG. 2 shows the result of an SIRD measurement of a semiconductor wafer epitaxially coated according to the prior art. Here, local stress fields can be seen in the surface of the semiconductor wafer with stress differences of up to 600 kPa. Stress fields can also be seen at the edge, which correspond to its stress differences of 13-45 kPa.

The interference patterns show no thickness variance of the wafer. "Fringes" are created by interference of the ordinary and extraordinary light rays, which respectively have a different propagation velocity.

Figure 3:
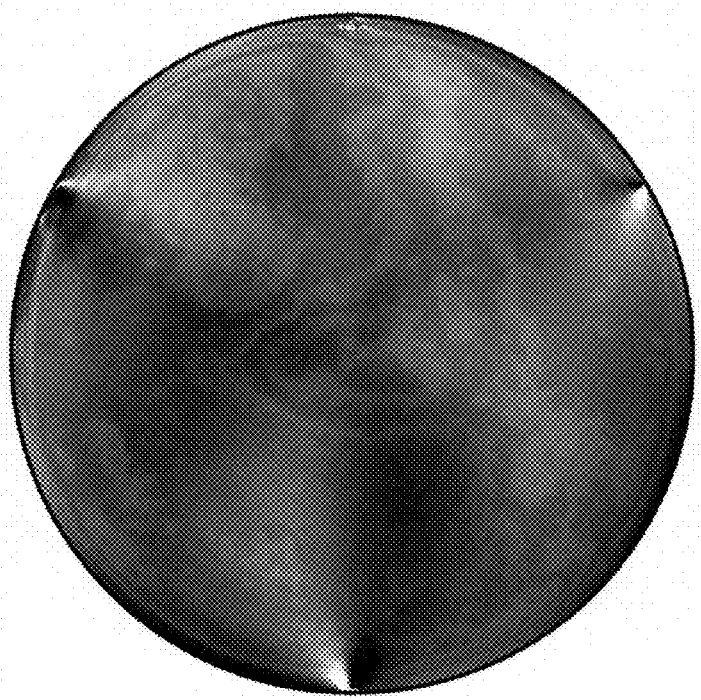
FIG. 3 shows the result of an SIRD measurement on a semiconductor wafer according to the invention.

FIG. 3 shows the result of an SIRD measurement on a semiconductor wafer according to the invention. The semiconductor wafer is free from any stress fields, measurable by means of SIRD, both in the surface and at the edge.

Bearing points of the semiconductor wafer on the supporting device of the SIRD measuring instrument can be seen at the edge. They are therefore not attributable to the method according to the invention, i.e. they do not correspond to stress fields such as in the prior art, which may result from the bearing points of the semiconductor wafer on the susceptor. No stress fields are detectable by means of SIRD. The semiconductor wafer thus has no stress fields with stress differences greater than or equal to 6 kPa.

Lastly, FIG. 4 shows the meaning of the bearing points visible in FIG. 3. Three bearing points can be seen, which are caused by the semiconductor wafer being supported on the supporting device of the SIRD instrument. Another point can furthermore be seen, which is attributable to a mechanical marking such as a notch or a flat, or to a laser marking.

These bearing points, and a mechanical marking which may be provided, can be seen in any SIRD measurement on a semiconductor wafer. They are, however, not critical stress fields which would be quantitatively detectable by means of SIRD.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing epitaxially coated semiconductor wafers, in which a multiplicity of prepared semiconductor wafers polished at least on their front sides are provided and successively coated individually by applying an epitaxial layer onto their polished front sides by chemical vapor deposition at temperatures of 800-1200° C. in a deposition reactor, comprising supporting a prepared semiconductor wafer to be epitaxially coated on a ring positioned between a susceptor and the semiconductor wafer which acts as a thermal buffer between the susceptor and the supported semiconductor wafer such that the semiconductor wafer rests on the ring, its backside faces a bottom of the susceptor having a gas-permeable structure but its backside does not touch the susceptor, such that gaseous substances are delivered from a region over the backside of the semiconductor wafer by gas diffusion through the susceptor into a region over the backside of the susceptor, the semiconductor wafer contacting the ring only in an edge region of the wafer backside, wherein the epitaxially coated semiconductor wafer comprises a front side and a backside, and is provided on its front side with an epitaxial layer that is free from stresses measurable by photoelastic stress measurement ("SIRD") and which has a nanotopography on its backside, expressed as PV height variation of greater than or equal to 2 nm and less than or equal to 5 nm based on square measurement windows with an area of 2 mm×2 mm and a backside "halo" expressed as haze of greater than or equal to 0.1 ppm and less than or equal to 5 ppm.

2. The method of claim 1, wherein the prepared semiconductor wafers are wafers of monocrystalline silicon.

3. The method of claim 1, wherein a deposition temperature of 1140-1180° C. is selected for epitaxial coating of p+ doped silicon wafers.

4. The method of claim 1, wherein a deposition temperature of 1100-1150° C. is selected for epitaxial coating of p− doped silicon wafers.

5. The method of claim 1, wherein the ring comprises silicon carbide.

6. The method of claim 1, wherein the ring comprises graphite coated with silicon carbide.

7. The method of claim 1, wherein the ring material has a thermal conductivity of 5-100 W/mK at a temperature of 1000° C.

8. The method of claim 1, wherein the ring material has a thermal conductivity of 5-50 W/mK at a temperature of 1000° C.

9. The method of claim 1, wherein the ring material has a thermal conductivity of 10-30 W/mK at a temperature of 1000° C.

10. The method of claim 1, wherein an inner diameter of the ring is less than the diameter of the semiconductor wafer for which the susceptor and the ring are configured.

11. The method of claim 1, wherein the ring has an annular recess having a width of 5-15 mm and a depth of 0.3-0.7 mm, in the direction of its inner diameter.

12. The method of claim 1, wherein the ring has a thickness of 0.5-1.5 mm.

13. The method of claim 1, wherein the susceptor has a porosity of at least 15% and a density of 0.5-1.5 g/cm$^3$.

14. A semiconductor wafer comprising a front side and a backside, which is provided on its front side with an epitaxial layer that is free from stresses measurable by photoelastic stress measurement ("SIRD") and which has a nanotopography on its backside, expressed as PV height variation of greater than or equal to 2 nm and less than or equal to 5 nm based on square measurement windows with an area of 2 mm×2 mm and a backside "halo" expressed as haze of greater than or equal to 0.1 ppm and less than or equal to 5 ppm.

15. The semiconductor wafer of claim 14, having an edge roll-off parameter of from −10 nm to +10 nm which corresponds to a deviation, measured at a distance of 1 mm from the edge of the silicon wafer, of an average cross section determined by thickness measurement from a reference line determined by regression.

16. The semiconductor wafer of claim 14, having a maximum local flatness value $SFQR_{max}$ of greater than or equal to 0.025 μm and less than or equal to 0.04 μm.

17. The semiconductor wafer of claim 14, having a resistance uniformity in the epitaxial layer of greater than or equal to ±2% and less than or equal to ±5%.

18. The semiconductor wafer of claim 14, having a recombination lifetime measured by μPCD of 2500-3000 μs.

19. The semiconductor wafer of claim 14, comprising a wafer of monocrystalline silicon, onto which an epitaxial silicon layer is applied, and having a diameter of 150 mm, 200 mm, 300 mm or 450 mm.

* * * * *